(12) United States Patent
Seeber

(10) Patent No.: US 6,812,701 B2
(45) Date of Patent: Nov. 2, 2004

(54) PHASED ARRAY MAGNETIC RESONANCE IMAGING COIL WITH IMPROVED SPIN LOCALIZATION

(75) Inventor: Derek Seeber, Wauwatosa, WI (US)

(73) Assignee: IGC - Medical Advances, Inc., Milwaukee, WI (US)

( * ) Notice: Subject to any disclaimer, the term of this patent is extended or adjusted under 35 U.S.C. 154(b) by 0 days.

(21) Appl. No.: 10/303,563

(22) Filed: Nov. 22, 2002

(65) Prior Publication Data

US 2004/0100262 A1 May 27, 2004

(51) Int. Cl.[7] ................................................. G01V 3/00
(52) U.S. Cl. ....................................... 324/318; 324/322
(58) Field of Search ................................ 324/318, 322, 324/314, 306, 307, 309, 300; 600/422

(56) References Cited

U.S. PATENT DOCUMENTS 4,682,112 A * 7/1987 Beer ........................... 324/322
4,712,068 A * 12/1987 Savelainen ................... 324/318
4,839,595 A * 6/1989 Boskamp ..................... 324/318
5,500,594 A * 3/1996 Leussler ...................... 324/318
6,534,983 B1 * 3/2003 Boskamp et al. ............ 324/318

OTHER PUBLICATIONS

CET 2000 Markus Weiger/Klaas Prismann, SENSE: Sensitivity Encoding for Fast MRI.

Sodickson. D.K., A Generalized Basis Approach to Spatial Encoding with Coil Arrays: SMASH–SENSE Hybrids and Improved Parallel MRI at High Accelerations.

www.bidmc.harvard.edu/cmr/smash/smash.html, SMASH Imaging Apr. 10, 2002.

* cited by examiner

Primary Examiner—Louis Arana
(74) Attorney, Agent, or Firm—Quarles & Brady LLP

(57) ABSTRACT

A phased array coil providing spatial discrimination for simultaneous spin acquisition maximizes transverse and longitudinal acceleration through the use of loops having boundaries tipped to the longitudinal axis.

24 Claims, 4 Drawing Sheets

PHASED ARRAY MAGNETIC RESONANCE IMAGING COIL WITH IMPROVED SPIN LOCALIZATION

CROSS-REFERENCE TO RELATED APPLICATIONS

STATEMENT REGARDING FEDERALLY SPONSORED RESEARCH OR DEVELOPMENT

BACKGROUND OF THE INVENTION

The present invention relates to Magnetic Resonance Imaging (MRI) and in particular to a local coil for use with SENSE, SMASH, and other imaging techniques in which the local coil helps distinguish between simultaneously acquired, but separate groups of spins.

In MRI, a uniform magnetic field, $B_0$, is applied to an imaged object along a longitudinal axis or z-axis of a Cartesian coordinate system. The effect of the magnetic field is to align the objects nuclear spins along the z-axis. A radio frequency (RF) excitation signal of the proper frequency oriented in the transverse or x-y plane is then applied to cause the nuclear spins to precess. During a detection stage, this precession is captured as a nuclear magnetic resonance (NMR) signal. Water, because of its relative abundance in biological tissue and the property of its nuclei, is the principal source of such NMR signals in medical imaging.

An image may be generated from the NMR signals by distinguishing among the locations of the source nuclear spins. In a conventional "slice select" imaging sequence, this is be done by limiting the RF excitation to a single slice in the x-y plane. Magnetic gradient fields are then applied along the transverse plane to modify the frequency and phase of the precession of the nuclear spins as a function of their location. A series of RF excitations with different x and y-axis gradient fields provides the data necessary to identify the contribution from nuclear spins in different locations to the NMR signal. The mapping of signal contribution to spin location provides the basis for an MRI image.

The NMR data obtained after each RF excitation provides one line of data in "k-space". Repetition of the RF excitation with different gradients provides different lines until an area is covered. The k-space area may then be converted to an image. A significant drawback to this other sequential acquisition of lines of k-space data is that the speed of generating in the image is severally limited.

Several techniques have been developed which allow simultaneous acquisition of multiple lines of k-space data from spatially separated regions of the patient. These techniques generally use the spatial information that can be derived from multiple receiving loops placed on each patient which has a different reception pattern for receiving the NMR signal. This additional spatial information allows NMR signals from different locations to be distinguished even though the NMR signals may have the same phase and frequency. Such techniques include Simultaneous Acquisition of Spatial Harmonics (SMASH) and Sensitivity Encoding Technique (SENSE) imaging techniques known to those of skill in the art. These and other techniques that allow simultaneous acquisition of multiple lines of k-space data will henceforth be termed "parallel acquisition techniques".

Referring now to FIG. 1, a prior art coil 10 suitable for use with parallel acquisition techniques provides a generally cylindrical form 12 aligned with the longitudinal or z-axis. The outer circumference of the cylindrical form supports four, phased array loops 14a to 4d. The loops 14a to 14d may be generally rectangular and in pairwise opposition along the x-axis with each loop 14a to 14d extending approximately 180 degrees about the circumference of the cylindrical form 12. Thus, the first pair of loops 14a and 14b are in opposition at one longitudinal end of the cylindrical form 12 and a second pair of loops 14c and 14d are in opposition about a second end of the form. Each of the loops 14a to 14d provides a separate signal transmission lead 16a to 16d so that NMR signals may be independently obtained from each coil and compared.

Referring now to FIG. 2, the reception patterns 18a to 18d, respectively, of loops 14a to 14d differ along the longitudinal axis (principally in being displaced with respect to one another either transversely or longitudinally) causing each loop 14a to 14d to have different sensitivities to the NMR signal from a given spin, for example, spin 20a. This difference in reception patterns 18 allows parallel acquisition of NMR signals from longitudinally displaced spins 20a and 20b experiencing the same RF excitation and gradient fields and allows for parallel acquisition of spins in up to four separate regions. Such a coil 10 is said to have an acceleration of two in the transverse direction and an acceleration of two in the longitudinal direction.

Considering now only loops 14a and 14c and two longitudinally displaced spins 20a and 20b within the reception patterns 18a and 18c, generally each of leads 16a and 16c will provide an NMR signal that is a combination of signals from spins 20a and 20b. For this simple case, the contributions of each spin 20a and 20b may be separated solving two equations relating the unknowns of contributions to known sensitivities of the two loops 14a and 14c (from their reception patterns 18a and 18b) and known signals from lines 16a and 16b. This process may be expanded for multiple spins and multiple coils using well-known algebraic techniques.

The coil 10, as shown in FIG. 1, may be further accelerated in the transverse plane by shortening the arc length of the loops 14 to of ninety degrees along the circumference of the cylindrical form 12 to provide four rather than two separate transverse regions of sensitivity. Unfortunately, limitations in the number of inputs in current MRI equipment for receiving separate leads 16 prevent the practical use of more than eight loops 14. Thus, in this case, acceleration along the z-axis must be eliminated if a transverse acceleration of four is desired.

BRIEF SUMMARY OF THE INVENTION

The present invention provides a local coil using loops that have reception patterns that are locally sensitive to both longitudinal and transverse displacement of spins. In one embodiment, these loops are triangular. By using loops that can provide either longitudinal or transverse acceleration, a more versatile coil is created. Thus, for example, the present invention can produce in theory a coil providing six transverse acceleration or two longitudinal acceleration requiring only six loops and six leads to the MRI machine.

Specifically, the present invention provides an MRI coil for use in a polarizing longitudinal magnetic field and having at least two loops transversely adjacent across an interface extending in part along the longitudinal axis. The interface is angled with respect to the longitudinal axis. Signal leads attached to the loops separately conduct signals received from each loop to processing circuitry.

Thus, it is one object of the invention to provide a coil with loops that can function for both transverse and longitudinal acceleration.

The two loops may be triangles, for example, right triangle or isosceles triangles.

Thus, it is another object of the invention to provide a loop shape that may be simply fabricated and designed.

The triangles may tile to fill a rectangular area.

Thus, it is another object of the invention to provide a loop shape readily adaptable to the rectangular surfaces of unwrapped cylinders or planes commonly used in local coils.

The loops may conform generally to the surface of a cylinder having an axis of radial symmetry parallel to the longitudinal axis or may conform to the surface of a plane parallel to the longitudinal axis or may conform to opposed surfaces of a rectangular prism extending along the longitudinal axis.

Thus, it is another object of the invention to provide a design adaptable to a wide variety of common coil topologies.

These particular objects and advantages may apply to only some embodiments falling within the claims, and thus do not define the scope of the invention.

DETAILED DESCRIPTION OF THE PREFERRED EMBODIMENT

Figure 1:
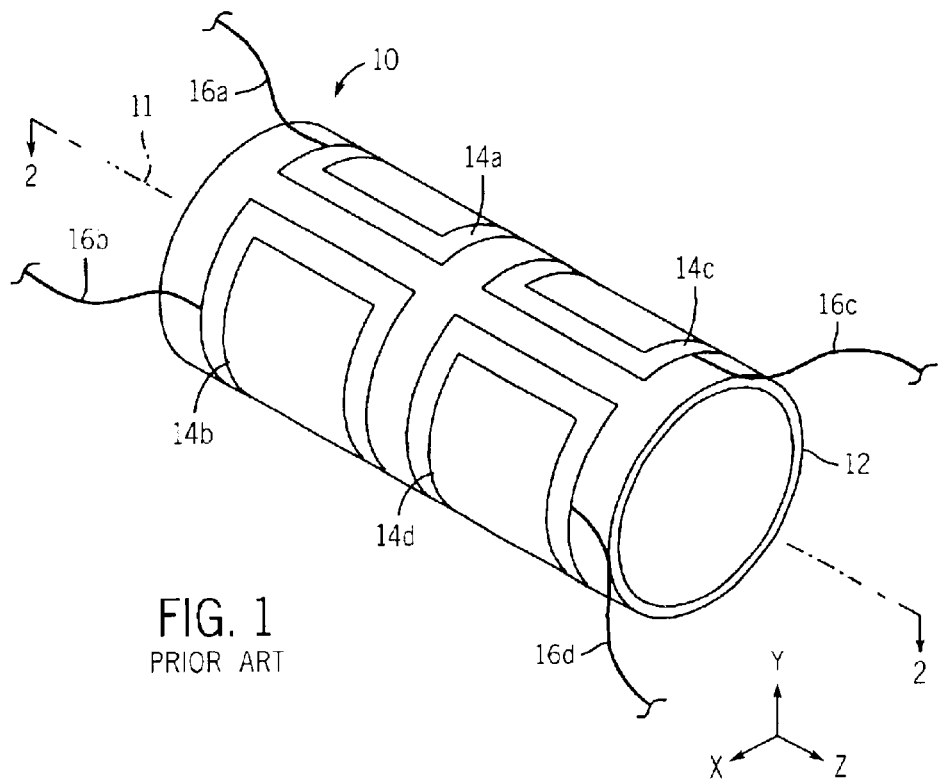
FIG. 1 is a perspective view of a simplified, prior art, multi-loop phased array coil useful for parallel acquisition techniques.
Figure 2:
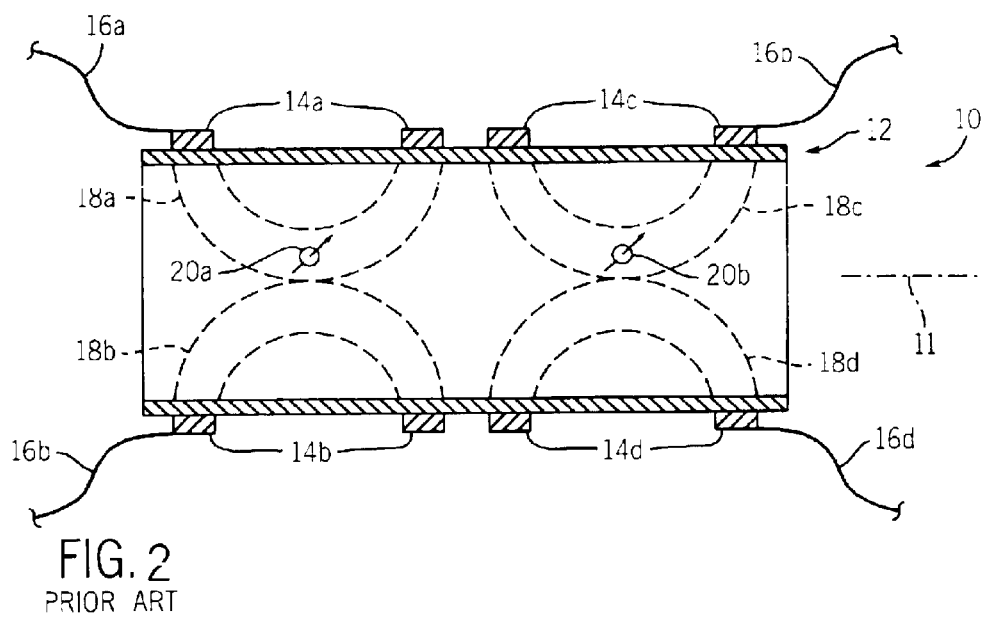
FIG. 2 is a cross-sectional view of the coil of FIG. 1 taken along lines 2—2 showing the different reception patterns of the loops of the coil of FIG. 1 as aids in parallel acquisition of NMR data.
Figure 3:
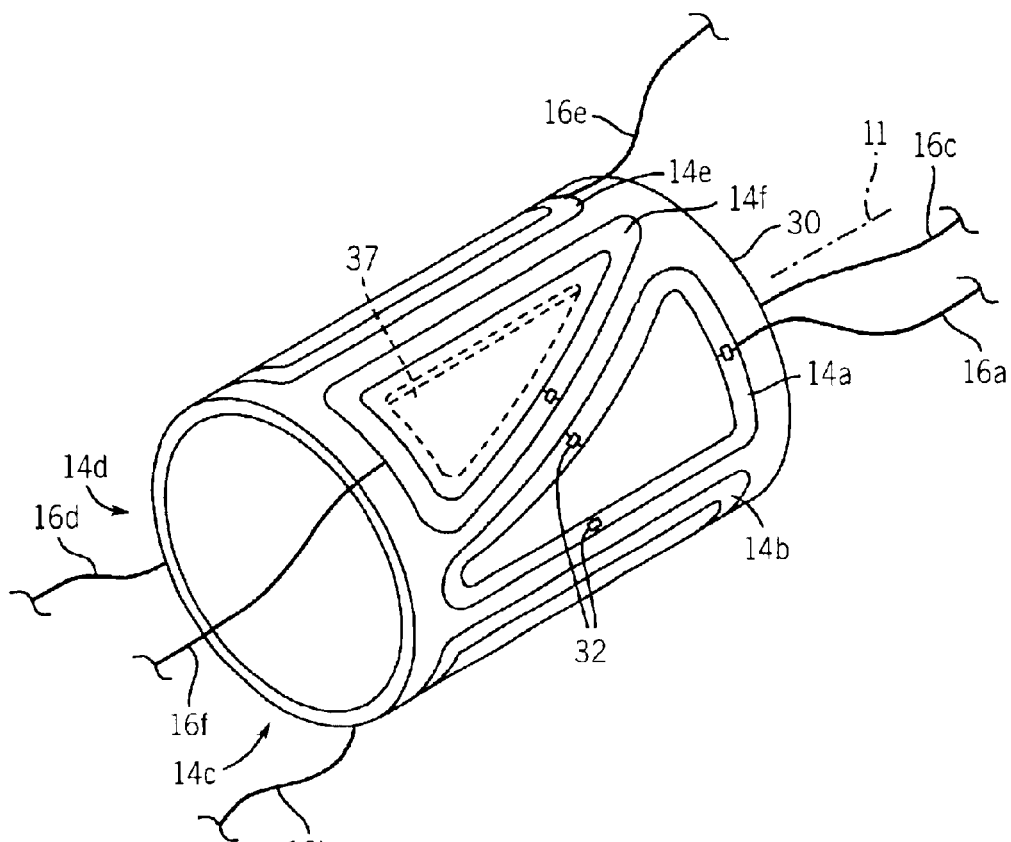
FIG. 3 is a figure similar to that of FIG. 1 showing the coil design of the present invention using right triangular loops.

Referring now to FIG. 3, in a first embodiment of the present invention a cylindrical coil form 30 suitable for head or torso imaging may provide for six loops 14a to 14f positioned on the circumference of the cylindrical coil form 30. Each of the loops 14a to 14f is a right triangle having one base aligned with a first or second end of the cylindrical coil form 30 (in alternating fashion), and a second base aligned with the longitudinal axis or z-axis 11.

The hypotenuse of each loop 14 is opposed to the hypotenuse of an adjacent loop 14 so that the loops 14a to 14f are paired. Thus, in this example, loops 14a and 14f are paired together to cover a rectangular area. Similarly, loops 14b and 14c, and loops 14d and 14e are paired and cover rectangular areas all of which tile smoothly around the circumference of the cylindrical coil form 30. The terms triangle and rectangle, as used herein are both triangles and rectangles on a plane and those on a curved surface such as the surface of a cylinder.

The loops 14a to 14f may be, for example, copper foil attached to an insulating cylindrical coil form 30 of fiberglass or the like. Cutouts 37 may be provided for access to the patient. The cylindrical coil form 30 may be rigid or flexible and may be covered with a housing or fabric or other material as is understood in the art. Tuning capacitors 32 may be placed in series with the conductors of the loops 14a to 14f to tune the loops 14a to 14f into resonance at the resonant frequency of the MRI with which the coil 10 will be used. Leads 16a to 16f may be attached to the loops 14a to 14f to provide six independent channels of MRI data.

Figure 4:
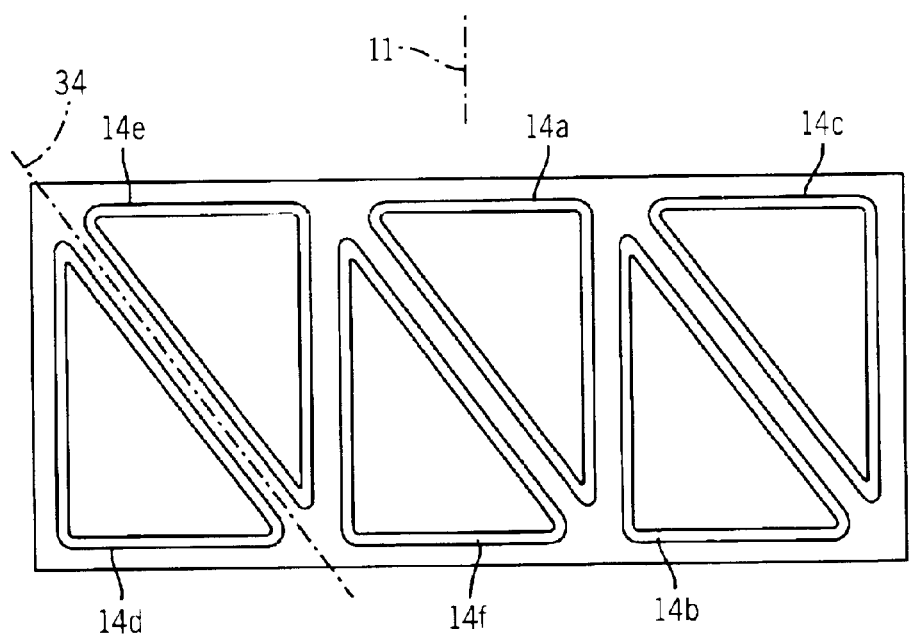
FIG. 4 is a view of the surface of the cylindrical coil of FIG. 3 unwrapped, showing the angle interface between the loops such as provides for z-axis sensitivity.

Referring now to FIG. 4, an interface 34 between the opposed hypotenuses of the pairs of loop 14a to 14f, for example, between loops 14a and 14f or between loops 14c and 14b or between loops 14c and 14d, is angled with respect to the longitudinal or z-axis 11. For coils 10 with some overlap between the loops 14a to 14f or where the opposing conductors of the 14a to 14f are not parallel, the interface 34 is a line defined by the locus of points midway between the adjacent loop walls.

The triangular shape of the loops 14a to 14f in coil 10 results in a fundamental change in the area of the loops 14a to 14f as one moves along the z-axis 11 changing the sensitivity of the loops 14a to 14f to nearby spins as a function of their location along the z-axis 11. Specifically, as a spin moves in the z-axis 11 downward in FIG. 4, the signal received by loop 14a will decrease while the signal received by coil 14f will increase. One feature of this embodiment is that for each loop 14 exhibiting a decreasing sensitivity with movement of spins along the z-axis in a first direction, there is a corresponding loop 14 that provides an increased sensitivity to those spins for the same axial movement.

Figure 5:
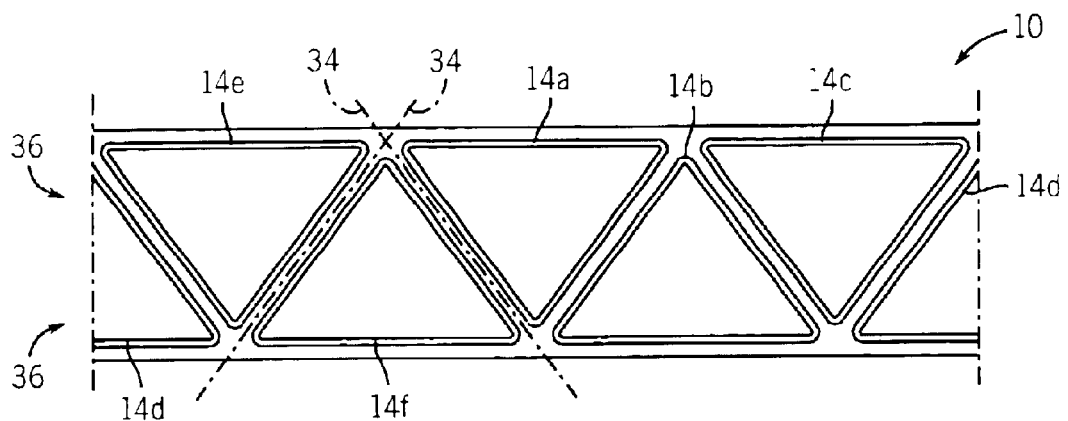
FIG. 5 is a figure similar to that of FIG. 4 showing an alternative design using loops that are isosceles triangles.

Referring now to FIG. 5, a variation on the coils of FIGS. 3 and 4 uses isosceles triangles as loops 14a to 14f. Here bases of the isosceles triangles for alternate loops 14a to 14b are on alternate edges 36 of the cylindrical coil form 30 and the equal length sides abut to define the interfaces 34. Unlike the previous example, where the loops 14a to 14f will tile to cover a rectangular area, loops 14a to 14f of FIG. 5 will tile only to fill a cylindrical ring. Note however, that unlike the coils of FIG. 3 and 4, no interfaces 34 are parallel to the z-axis 11.

Figure 6:
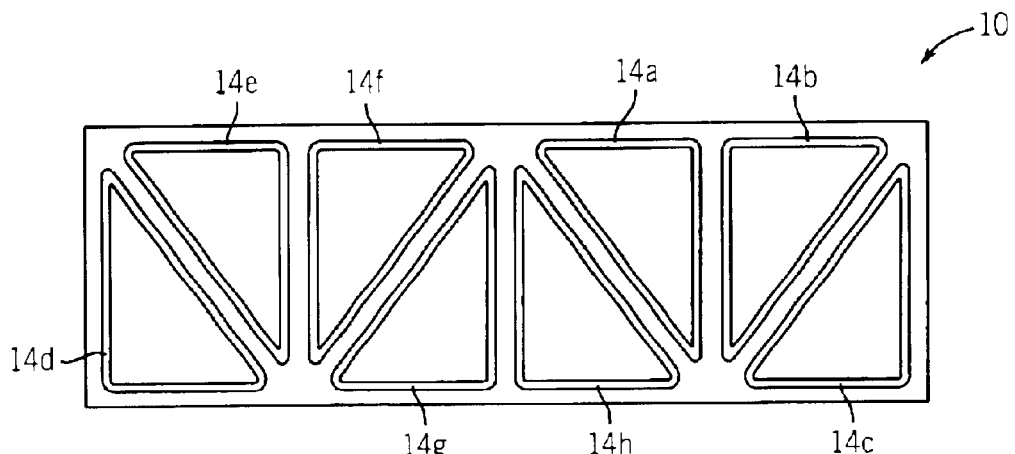
FIG. 6 is a figure similar to that of FIG. 4 showing a six-channel coil where alternate loop pairs have the opposite orientation of their neighbors.

Referring now to FIG. 6 in yet a further embodiment of the coil 10, the loops 14 may be eight right triangular elements providing for loops 14a to 14h. In this case, adjacent coil pairs exhibit mirror symmetric with respect to their neighbors. The interfaces 34 of adjacent pairs of loops are nonparallel. This coil requires an MRI machine that can accept eight inputs or the use of a multiplexer.

Figure 7:
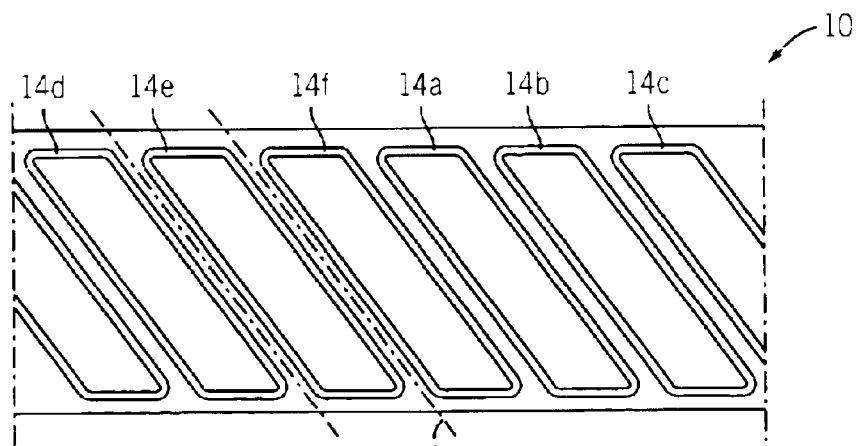
FIG. 7 is an alternative embodiment in which the loops are parallelograms.

In yet a further embodiment shown in FIG. 7, the loops 14 are parallelograms providing tipped interfaces 34 between transversally adjacent coils 14. Unlike the previous embodiments, this embodiment produces an ambiguous zone near the center of the coil 10 where z-axis location of simultaneously excited spins cannot be distinguished.

Figure 8:
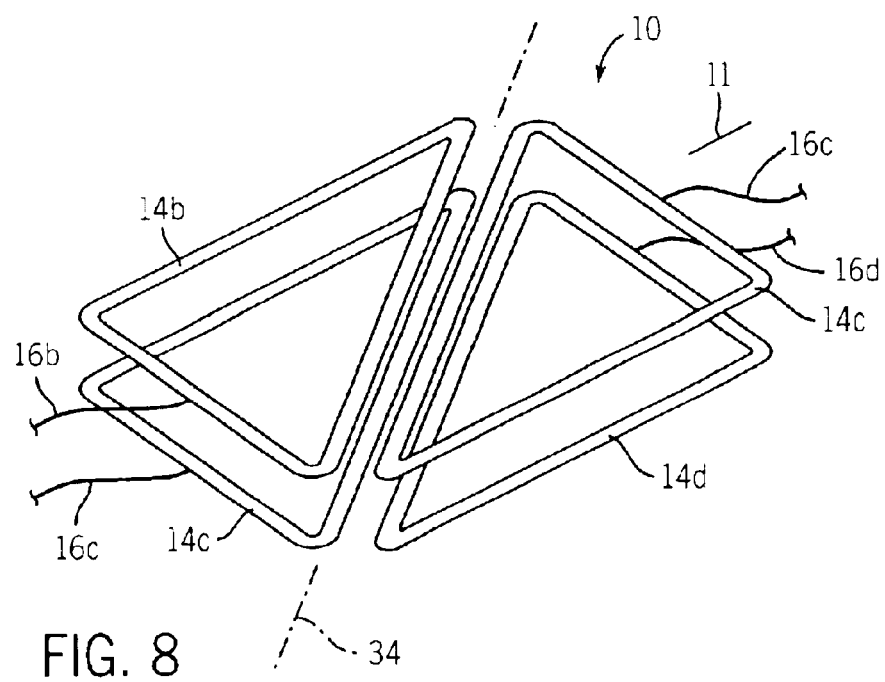
FIG. 8 is a perspective view of a coil constructed of opposed planar elements using the present invention design.

Referring to FIG. 8, the present invention may be extended to coils 10 having a single planar or opposed planar loops. In the embodiment of FIG. 8, four loops 14a to 14d are arranged pairwise in two planes with their hypotenuses adjacent to define the interface 34. Pairs of planes are offset as if on the surface of opposed faces of a rectangular prism.

Figure 9:
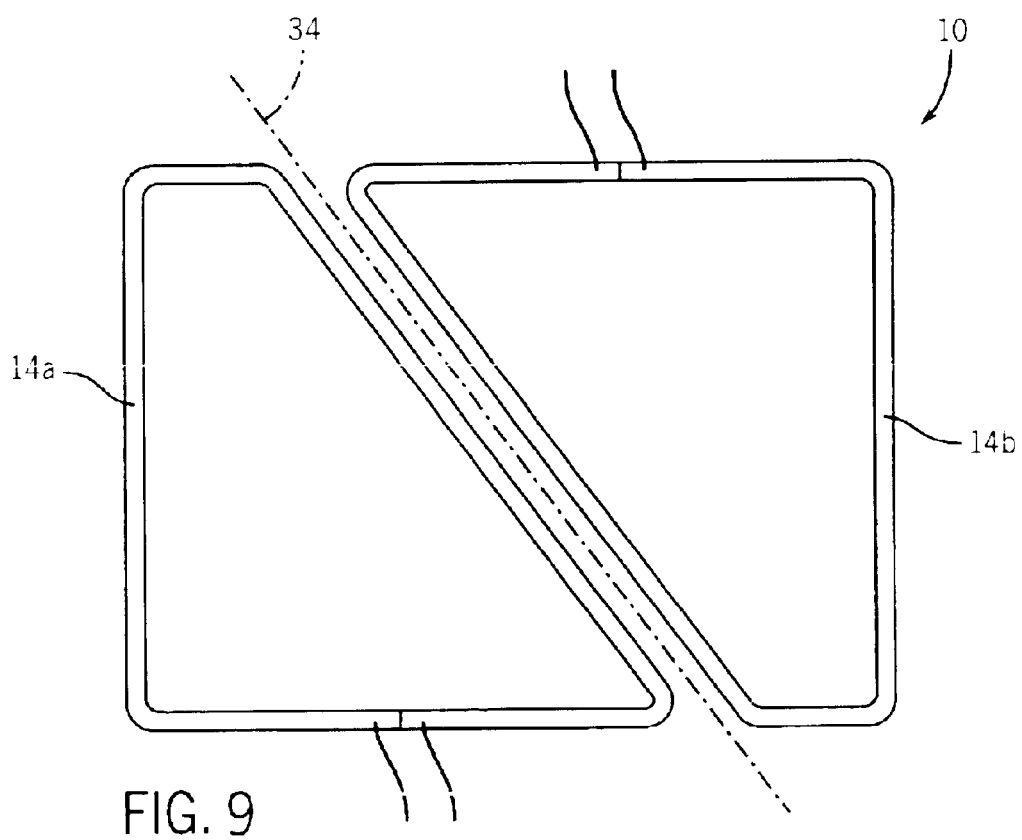
FIG. 9 is a planar view of an alternative loop design using truncated triangles.

Referring to FIG. 9, the present invention may be extended to coils 10 having loops 14a and 14b with a perimeter that conforms to a quadrilateral polygon in which opposite sides converge and in which opposed parallel bases are of substantially different lengths so as to create in this case, but not be limited to, a truncated triangle. Pairs of loops 14a and 14b of this embodiment may be used in the above-described coils.

It is specifically intended that the present invention not be limited to the embodiments and illustrations contained herein, but include modified forms of those embodiments including portions of the embodiments and combinations of elements of different embodiments as come within the scope of the following claims.

I claim:

1. An MRI coil for use in a polarizing longitudinal magnetic field, the coil comprising:
   at least two loops having transversely opposed sides defined by substantially parallel conductors, with one conductor on each of the two loops, the conductors extending substantially the entire length of the opposed sides and being substantially aligned with and parallel to an interface extending in part along the longitudinal axis, the interface being angled with respect the longitudinal axis; and
   signal leads attached to the loops for separately conducting signals received from each loop to MRI processing circuitry.

2. MRI coil of claim 1 wherein the two loops are triangles.

3. The MRI coil of claim 2 wherein the triangles tile to fill a rectangular area.

4. The MRI coil of claim 2 wherein the triangles are right triangles.

5. The MRI coil of claim 1 wherein the longitudinally angled interfaces of sequential pairs of loops are nonparallel.

6. The MRI coil of claim 2 wherein the triangles are isosceles triangles.

7. The MRI coil of claim 1 wherein the loops conform generally to the surface of a cylinder having an axis of radial symmetry parallel with the longitudinal axis.

8. The MRI coil of claim 1 wherein the loops conform generally to the surface of a plane parallel to the longitudinal axis.

9. The MRI coil of claim 1 wherein the loops conform generally to two opposed surfaces of a rectangular prism extending along the longitudinal axis.

10. The MRI coil of claim 9 wherein the loops on the opposed surfaces are mirror images about a plane bisecting the rectangular prism between the two opposed surfaces.

11. The MRI coil of claim 1 wherein alternate adjacent loops have first sensitivities that increase with distance along the longitudinal axis for a given range and direction, and second sensitivities that decrease with distance along the longitudinal axis for the given range and direction.

12. The MRI coil of claim 1 wherein there are six loops.

13. A method of acquiring MRI image data of an imaged object comprising the steps of:
   (a) placing an MRI coil in a polarizing longitudinal magnetic field, the coil comprising:
   at least two loops transversely adjacent across an interface extending along the longitudinal axis, the interface being angled with respect the longitudinal axis;
   (b) stimulating NMR in at least two longitudinally separated regions of the imaged object;
   (c) simultaneously detecting the NMR signals with each loop; and
   (d) determining the longitudinal source of the NMR signals in the imaged object by comparison of the NMR signals detected at each loop.

14. The method of claim 13 wherein the two loops are triangles.

15. The method of claim 14 wherein the triangles are right triangles.

16. The method of claim 14 wherein the longitudinally angled interfaces of sequential pairs of loops are nonparallel.

17. The method of claim 14 wherein the triangles are isosceles triangles.

18. The method of claim 13 wherein the triangles have mirror symmetry across a plane perpendicular to the longitudinal axis.

19. The method of claim 13 where the loops conform generally to the surface of a cylinder having an axis of radial symmetry parallel with the longitudinal axis.

20. The method of claim 13 wherein the loops conform generally to the surface of a plane parallel to the longitudinal axis.

21. The method of claim 13 wherein the loops conform generally to two opposed surfaces of a rectangular prism extending along the longitudinal axis.

22. The method of claim 21 wherein the loops on the opposed surfaces are mirror images about a plane bisecting the rectangular prism between the two opposed surfaces.

23. The method of claim 13 wherein step (d) employs the SMASH MRI protocol.

24. The method of claim 13 wherein step (d) employs the SENSE MRI protocol.

\* \* \* \* \*

UNITED STATES PATENT AND TRADEMARK OFFICE
CERTIFICATE OF CORRECTION

PATENT NO. : 6,812,701 B2
DATED : November 2, 2004
INVENTOR(S) : Derek Seeber

It is certified that error appears in the above-identified patent and that said Letters Patent is hereby corrected as shown below:

Column 4,
Line 20, "loops 14c and" should be -- loops 14e and --

Signed and Sealed this

Tenth Day of May, 2005

JON W. DUDAS
*Director of the United States Patent and Trademark Office*